(12) United States Patent
van den Oever

(10) Patent No.: US 8,598,627 B2
(45) Date of Patent: Dec. 3, 2013

(54) P-TYPE FIELD-EFFECT TRANSISTOR AND METHOD OF PRODUCTION

(75) Inventor: Léon C. M. van den Oever, Rosmalen (NL)

(73) Assignee: EPCOS AG, Munich (DE)

(*) Notice: Subject to any disclaimer, the term of this patent is extended or adjusted under 35 U.S.C. 154(b) by 28 days.

(21) Appl. No.: 13/127,318

(22) PCT Filed: Nov. 12, 2009

(86) PCT No.: PCT/EP2009/065067
§ 371 (c)(1),
(2), (4) Date: Jun. 20, 2011

(87) PCT Pub. No.: WO2010/055102
PCT Pub. Date: May 20, 2010

(65) Prior Publication Data
US 2011/0241076 A1    Oct. 6, 2011

(30) Foreign Application Priority Data
Nov. 13, 2008   (EP) ...................................... 08169044

(51) Int. Cl.
*H01L 29/78* (2006.01)
(52) U.S. Cl.
USPC ............ 257/192; 257/E21.403; 257/E21.407; 257/E21.429; 257/E21.441; 257/E29.27; 438/235; 438/271; 438/282

(58) Field of Classification Search
CPC ...................................................... H01L 29/775
USPC ........... 257/192, E21.403, E21.407, E21.429, 257/E21.441, E29.252, E29.27; 438/235, 438/271, 282
See application file for complete search history.

(56) References Cited

U.S. PATENT DOCUMENTS

| | | | |
|---|---|---|---|
| 4,003,126 A | 1/1977 | Holmes et al. | |
| 5,187,110 A * | 2/1993 | Aina et al. | 438/235 |
| 5,382,814 A * | 1/1995 | Ashley et al. | 257/197 |
| 5,393,680 A * | 2/1995 | Shikata | 438/590 |
| 6,326,317 B1 | 12/2001 | Wang et al. | |
| 7,038,253 B2 * | 5/2006 | Yoshida et al. | 257/192 |
| 7,217,960 B2 * | 5/2007 | Ueno et al. | 257/103 |
| 8,410,572 B2 * | 4/2013 | van den Oever | 438/172 |
| 2007/0173010 A1 | 7/2007 | Lee et al. | |
| 2007/0254418 A1 * | 11/2007 | Sheppard et al. | 257/24 |
| 2012/0298958 A1 * | 11/2012 | Dewey et al. | 257/474 |

FOREIGN PATENT DOCUMENTS

JP    61-236155 A    10/1986

OTHER PUBLICATIONS

Tu, S.L., et al., "High Breakdown P-Channel InSb MOSFET." Japanese Journal of Applied Physics, Mar. 1990, No. 3, Part 2, 3 pages.

(Continued)

*Primary Examiner* — Zandra Smith
*Assistant Examiner* — Toniae Thomas
(74) *Attorney, Agent, or Firm* — Slater & Matsil, L.L.P.

(57) ABSTRACT

An n-layer is arranged above a substrate, which can be GaAs, and a p-layer (4) is arranged on the n-layer. The p-layer is separated by a gate electrode into two separate portions forming source and drain. The gate electrode is insulated from the semiconductor material by a gate dielectric. Source/drain contacts are electrically conductively connected with the portions of the p-layer.

16 Claims, 2 Drawing Sheets

(56) References Cited

OTHER PUBLICATIONS

Johnson, G., et al., "InGaAs Field-Effect Transistors with Submicron Gates for *K*-Band Applications," IEEE Transactions on Microwave Theory and Techniques, Mar. 1992, No. 3., pp. 429-433.

Basso, T.D., et al., "A Complementary GaAs Microprocessor for Space Applications," Proc. of the Second International Conference on Integrated Micro-Nanotechnology for Space Applications, Nov. 1-3, 1998, 12 pages.

Remashan, K., et al., "GaAs Metal Insulator Field Effect Transistors with Excellent Intrinsic Transconctance and Stable Drain Currents Using $(NH_4)_2S_x$ Chemical Treatment," IEEE Electron Device Letters, Dec. 12, 1998, vol. 19, No. 12, pp. 466-468.

Wagner, III, W.E., et al., "Characterization of Silicon Carbide (SiC) Epitaxial Channel MOSFETs," IEEE Transactions on Electron Devices, Nov. 11, 2000, vol. 47, No. 11, pp. 2214-2220.

Henderson, T., et al., "High-Performance BiHEMT HBT / E-D pHEMT Integration," CS MANTECH Conference. May 14-17, 2007, 4 pages.

Lin, C.K., et al., "Monolithic Integration of E/D-mode pHEMT and InGaP HBT Technology on 150mm GaAs Wafers," CS MANTECH Conference. May 14-17, 2007, 4 pages.

Peatman, W., et al., "InGaP-*Plus*™: Advanced GaAs BiFET Technology and Applications," CS MANTECH Conference. May 14-17, 2007, 4 pages.

Ramanathan, R., et al., "Commercial Viability of a Merged HBT-FET (BiFET) Technology for GaAs Power Amplifiers," CS MANTECH Conference. May 14-17, 2007, 5 pages.

\* cited by examiner

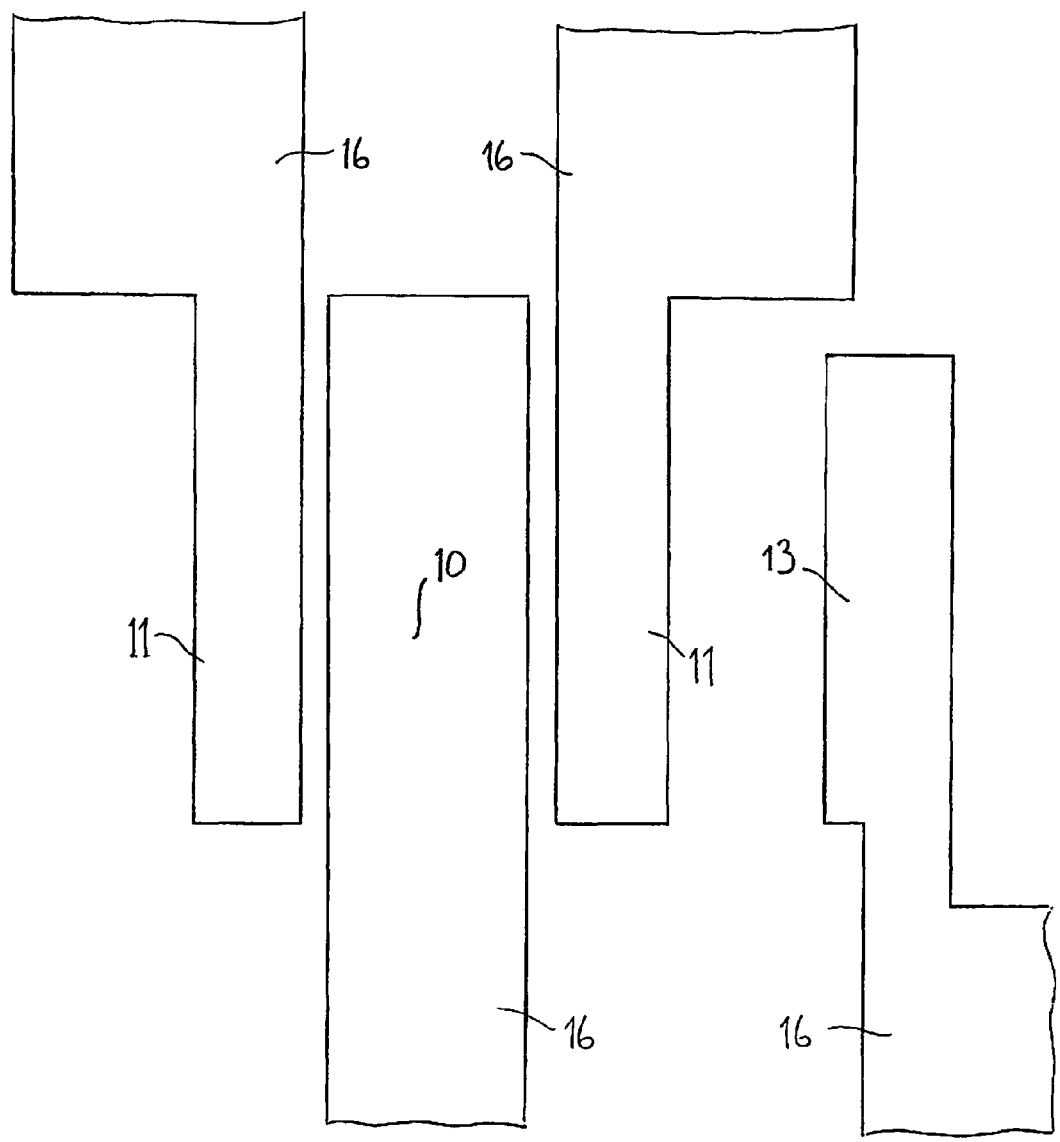

P-TYPE FIELD-EFFECT TRANSISTOR AND METHOD OF PRODUCTION

This patent application is a national phase filing under section 371 of PCT/EP2009/065067, filed Nov. 12, 2009, which claims the priority of European patent application 08169044.8, filed Nov. 13, 2008, each of which is incorporated herein by reference in its entirety.

BACKGROUND

GaAs semiconductor technology provides transistor devices of the npn bipolar transistor and n-FET types. Circuit design and system functionality require p-type devices, especially pnp bipolar transistors or p-channel field-effect transistors, which are not provided in the GaAs technology up to now. With only n-type devices available in GaAs technology, other circuit concepts are applied at the expense of increased current consumption, larger occupied area and other shortcomings. Semiconductor circuits in silicon comprise both n-type and p-type devices, but this is not the preferred technology for power amplifiers, especially in industrial applications. Although the lacking p-type transistor components can be provided on external circuit components, a full integration of both types of transistors is desired also in GaAs technology.

Merged or stacked FET-HBT integration schemes, often called BiFET or BiHEMT and containing both HBT and FET or P-HEMT devices on a single GaAs substrate, are reported in the following papers from the CS MANTECH Conference 2007: William Peatman, Mohsen Shokrani, Boris Gedzberg, Wojciech Krystek, and Michael Trippe: "InGaP-Plus™: Advanced GaAs BiFET Technology and Applications"; T. Henderson, J. Middleton, J. Mahoney, S. Varma, T. Rivers, C. Jordan, and B. Avrit: "High-Performance BiHEMT HBT/E-D pHEMT Integration"; Todd D. Basso and Richard B. Brown: "A Complementary GaAs Microprocessor for Space Applications"; and Ravi Ramanathan, Mike Sun, Peter J. Zampardi, Andre G. Metzger, Vincent Ho, Cejun Wei, Peter Tran, Hongxiao Shao, Nick Cheng, Cristian Cismaru, Jiang Li, Shiaw Chang, Phil Thompson, Mark Kuhlman, Kenneth Weller: "Commercial Viability of a Merged HBT-FET (BiFET) Technology for GaAs Power Amplifiers"; C. K. Lin, T. C. Tsai, S. L. Yu, C. C. Chang, Y. T. Cho, J. C. Yuan, C. P. Ho, T. Y. Chou, J. H. Huang, M. C. Tu, and Y. C. Wang: "Monolithic Integration of E/D-mode pHEMT and InGaP HBT Technology on 150-mm GaAs Wafers".

SUMMARY OF THE INVENTION

In one aspect, the present invention provides a p-channel field-effect transistor in GaAs technology. In another aspect, an efficient production method of a p-channel field-effect transistor in GaAs technology is disclosed.

These and other objects are achieved by the p-type field-effect transistor according to claim 1 and the method of production according to claim 6, respectively.

The field-effect transistor is based on a layer structure that can be used to manufacture npn bipolar transistors. A p-doped layer, which can also serve as a base layer of a bipolar transistor, is divided into two separate portions by a recess, in which a gate electrode is located. The gate electrode is on a gate dielectric layer and controls the space charge in the channel in an n-doped layer, which can also serve as a collector layer of a bipolar transistor. Thus, the p-channel field-effect transistor can be arranged in a layer sequence that can be used in a vertical npn bipolar transistor. Furthermore, this layer sequence can be laterally confined to form a mesa on a substrate surface. An $n^+$-doped layer, which can also serve as subcollector layer of a bipolar transistor, can be positioned under the mesa and be provided with an external electric connection functioning as a bulk contact of the field-effect transistor.

BRIEF DESCRIPTION OF THE DRAWINGS

Examples of the field-effect transistor and the production method are described in more detail in conjunction with the appended figures.

FIG. 2 shows a schematic plan view of the electric contacts and connections of the p-FET.

DETAILED DESCRIPTION OF ILLUSTRATIVE EMBODIMENTS

Figure 1:
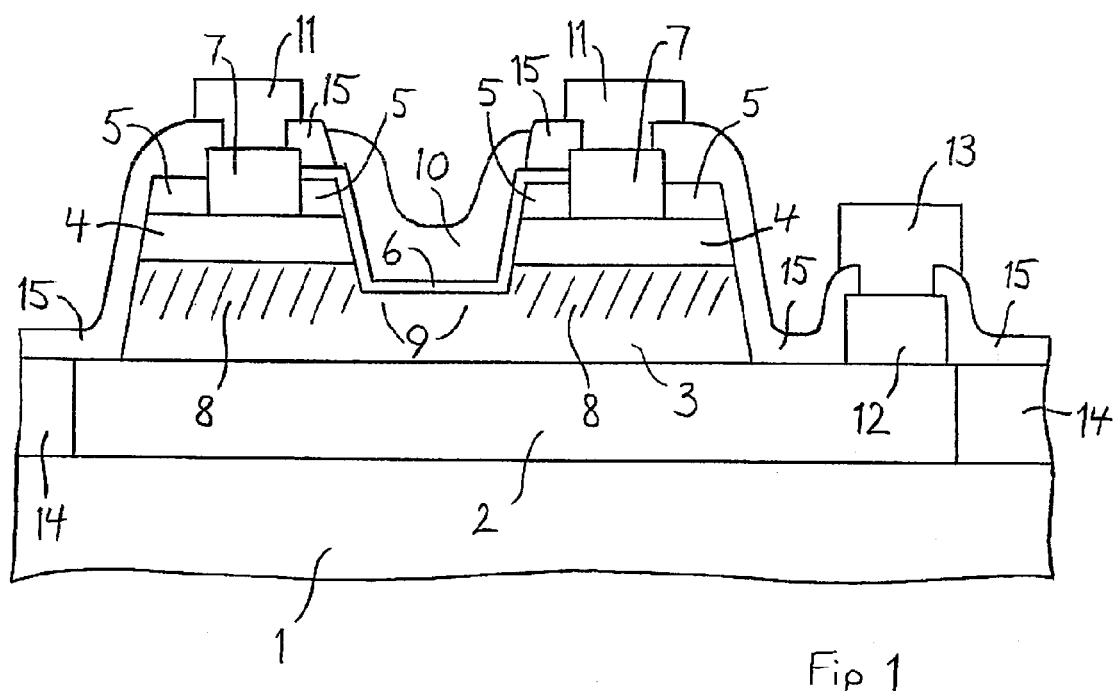
FIG. 1 shows a cross-section of an embodiment of the p-FET.

FIG. 1 shows a cross-section of an embodiment of the p-channel field-effect transistor. An $n^+$-layer 2 is located on an upper surface of a substrate 1, which can be especially GaAs. On the $n^+$-layer 2, a layer sequence is arranged forming a mesa, which comprises an p-layer 3, a p-layer 4 and a further n-layer 5. This layer sequence can be provided for npn bipolar transistors, which can be manufactured on the same substrate. Thus, the field-effect transistor can use the layer sequence of a standard GaAs HBT manufacturing technology. The upper n-layer 5, which is shown in the cross-section of FIG. 1, is not necessary for the field-effect transistor. It could therefore be left out or removed, but it can be left on the p-layer 4 as well if the layer sequence as shown in FIG. 1 is provided in the production method.

The p-layer 4 is divided by a trench or recess into two separate portions as shown in FIG. 1. The bottom and sidewalls of the recess are covered with a relatively thin gate dielectric 6. Optionally, source/drain contact layers 7, preferably a metal, may be arranged on the surface of the portions of the p-layer 4. The regions that are occupied by space charge regions 8 during the operation of the transistor are indicated by the hatched areas in FIG. 1. A channel region 9 is provided under the gate dielectric 6 within the lower n-layer 3 between the space charge regions 8. Since the channel region 9 is located in n-doped semiconductor material, it is provided for a p-channel field-effect transistor. A gate electrode 10, which can be a metal, is arranged in the recess on the gate dielectric 6. Source/drain contacts 11 are provided for source and drain and, in this embodiment, arranged on the source/drain contact layers 7. The source/drain contacts 11 are preferably a metal.

The $n^+$-layer 2 can be provided as a subcollector layer of a vertical npn transistor. In the field-effect transistor, the $n^+$-layer 2 can be used to provide a bulk contact. To this purpose, a bulk contact layer 12, preferably a metal, can be arranged on the upper surface of the $n^+$-layer 2 in an area that is not covered by the n-layer 3. A bulk contact 13, which is preferably metal, is applied to the bulk contact layer 12. An isolating layer 14 on the level of the $n^+$-layer 2 can be provided as a lateral insulation of the $n^+$-layer 2, and a further dielectric layer 15 can be provided as a passivation and electric insulation between the various electric contacts on the upper side of the device. The arrangement and shape of the layers, especially the gate dielectric 6, the dielectric layer 15, and the contact layers, may deviate from the example of FIG. 1 and can be varied in order to optimize the performance of the field-effect transistor.

The field-effect transistor is especially advantageous in that the source/drain regions are formed by portions of the p-layer 4, which can also serve as the base layer of a vertical npn bipolar transistor, and the channel region is located in an n-layer 3, which can also serve as a collector layer of an npn bipolar transistor. The source/drain regions are completely separated from one another by the recess comprising the gate electrode and the gate dielectric. Thus there is no direct connection via p-doped semiconductor material between the two portions of the p-layer 4. In this manner, a sequence of p-doped, n-doped and p-doped semiconductor layers can be used to form a field-effect transistor of essentially lateral structure.

FIG. 2 shows the layout of the electrically conducting tracks in a schematic plan view. The gate electrode 10 is shown to be arranged between the source/drain contacts 11, while the bulk contact 13 is arranged laterally to the other contacts. In this example every contact 10, 11, 13 is electrically conductively connected with a contact pad 16, which can be used to apply an external electric connection. But the design of the conducting tracks and contact layers can be varied according to the requirements of each individual embodiment. Thus there is a large variety of possibilities to integrate the field-effect transistor together with other devices, especially vertical bipolar transistors.

The field-effect transistor can be manufactured within a standard GaAs technology together with vertical bipolar transistors. The method of production of the field-effect transistor can comprise the steps of applying an n-layer and a p-layer above a substrate of semiconductor material, especially of GaAs, the layers being preferably structured in the shape of a mesa. A recess or trench is etched into the p-layer in order to form two separate portions, which are not connected by p-doped semiconductor material. A gate dielectric is arranged on the bottom and sidewalls of the recess. The gate dielectric can be silicon nitride, which can be used within a standard GaAs HBT technology. A gate electrode, preferably formed from metal, is arranged in the recess on the gate dielectric. Source/drain contacts are arranged in electric connection with the portions of the p-layer forming source and drain. An n$^+$-layer can be arranged between the substrate and the mesa comprising the n-layer and the p-layer. The n$^+$-layer can be provided with a bulk contact and with a bulk contact layer between the bulk contact and the n$^+$-layer.

The method can be used to also produce vertical bipolar transistors. To this end, a further n-layer is arranged on the p-layer. The n$^+$-layer is used as a subcollector layer, and the lower n-layer, the p-layer and the upper n-layer are used in this sequence as collector layer, base layer and emitter layer of a vertical npn bipolar transistor. The layer sequence can be structured, especially by forming mesas for each individual device, and the field-effect transistor is produced by forming the recess that is intended for the gate electrode.

Thus only a slight modification of the standard production process of vertical bipolar transistors in GaAs technology enables the production of p-channel field-effect transistors in this semiconductor material. The production method is therefore compatible with standard GaAs HBT technology, does not require essential variations of the process steps and masks and is therefore highly cost-effective. An optimization of the electric properties of the field-effect transistor is easily achieved by an adaptation of the dimensions of the gate electrode, the thickness of the gate dielectric and the arrangement of the contact layers.

The following list of reference numerals can be used in conjunction with the drawings:

1 substrate
2 n$^+$-layer
3 n-layer
4 p-layer
5 further n-layer
6 gate dielectric
7 source/drain contact layer
8 space charge region
9 channel region
10 gate electrode
11 source/drain contact
12 bulk contact layer
13 bulk contact
14 isolating layer
15 dielectric layer
16 contact pad

The invention claimed is:

1. A p-type field-effect transistor, comprising:
   a substrate of GaAs;
   an n$^+$-layer;
   an n-layer arranged on the n$^+$-layer, the n-layer having a surface, the n-layer being located above the substrate;
   a p-layer having two separate portions arranged on the surface of the n-layer;
   a gate electrode between the portions of the p-layer;
   a gate dielectric located between the gate electrode and the n-layer and between the gate electrode and each portion of the p-layer;
   a first source/drain contact electrically conductively connected to one of the portions of the p-layer; and
   a second source/drain contact electrically conductively connected to the other of the portions of the p-layer.

2. The field-effect transistor according to claim 1, further comprising a bulk contact electrically conductively connected to the n$^+$-layer.

3. The field-effect transistor according to claim 1, wherein the n-layer and the p-layer form a mesa.

4. The field-effect transistor according to claim 1, further comprising a first source/drain contact layer between the first source/drain contact and the p-layer and a second source/drain contact layer between the second source/drain contact and the p-layer.

5. A semiconductor device comprising:
   the p-type field-effect transistor according the claim 1; and
   a vertical npn heterojunction bipolar transistor disposed at a second region of the GaAs substrate and laterally spaced from the field effect transistor, the heterojunction bipolar transistor comprising:
   a collector located in the first n-layer;
   a base located in the p-layer over the collector; and
   an emitter located in the second n-layer over the base.

6. The device according to claim 5, wherein the heterojunction bipolar transistor further comprises a subcollector located in the n+ layer.

7. The device according to claim 5, further comprising a first source/drain contact electrically conductively connected to first source/drain the first portion of the p-layer and a second source/drain contact electrically conductively connected to second source/drain the second portion of the p-layer.

8. The device according to claim 7, further comprising a first source/drain contact layer arranged between the first source/drain contact and the first portion of the p-layer and a second source/drain contact layer arranged between the second source/drain contact and the second portion of the p-layer.

9. The device according to claim 5, further comprising a bulk contact electrically conductively connected to the $n^+$-layer.

10. The device according to claim 5, wherein the first n-layer, the player and the second n-layer form a mesa.

11. The device according to claim 5, wherein the gate electrode is formed in a recess between the first portion of the p-layer and the second portion of the p-layer.

12. The device according to claim 5, wherein the gate dielectric comprises silicon nitride.

13. A method for forming a field-effect transistor, the method comprising:
    forming a layer sequence above a surface of a substrate of GaAs provided with an $n^+$-layer; the layer sequence comprising an n-layer on the $n^+$-layer and a p-layer on the n-layer;
    forming a recess in the p-layer such that the p-layer is divided into two separate portions,
    forming a gate dielectric in the recess,
    forming a gate electrode over the gate dielectric;
    applying source/drain contacts to each of the portions of the p-layer; and
    applying a bulk contact to the $n^+$-layer.

14. The method according to claim 13, wherein the gate dielectric comprises silicon nitride.

15. A method for forming a field-effect transistor, the method comprising:
    forming a layer sequence above a surface of a substrate of GaAs provided with an $n^+$-layer; the layer sequence comprising an n-layer on the $n^+$-layer and a p-layer on the n-layer;
    forming a recess in the p-layer such that the p-layer is divided into two separate portions,
    forming a gate dielectric in the recess,
    forming a gate electrode over the gate dielectric;
    applying source/drain contacts to each of the portions of the p-layer;
    wherein forming the layer sequence comprises performing a manufacturing process of an npn HBT to form the n-layer, the p-layer and a further n-layer that is applied on the p-layer and to structure the layers to form the field-effect transistor and an npn bipolar transistor, wherein a subcollector of the npn bipolar transistor is formed in the $n^+$-layer.

16. The method according to claim 15, wherein the gate dielectric comprises silicon nitride.

\* \* \* \* \*

UNITED STATES PATENT AND TRADEMARK OFFICE
CERTIFICATE OF CORRECTION

| | | |
|---|---|---|
| PATENT NO. | : 8,598,627 B2 | Page 1 of 1 |
| APPLICATION NO. | : 13/127318 | |
| DATED | : December 3, 2013 | |
| INVENTOR(S) | : Leon C. M. van den Oever | |

It is certified that error appears in the above-identified patent and that said Letters Patent is hereby corrected as shown below:

In the Claims

In Col. 5, line 5, claim 10, delete "player" and insert --p-layer--.

Signed and Sealed this
Twenty-fifth Day of March, 2014

Michelle K. Lee
*Deputy Director of the United States Patent and Trademark Office*